United States Patent
Zhao et al.

(10) Patent No.: US 12,336,353 B2
(45) Date of Patent: Jun. 17, 2025

(54) DRIVING BACKPLANE, MANUFACTURING METHOD THEREOF, AND LIGHT-EMITTING SUBSTRATE

(71) Applicants: Hefei Xinsheng Optoelectronics Technology Co., Ltd., Anhui (CN); BOE Technology Group Co., Ltd., Beijing (CN)

(72) Inventors: Xue Zhao, Beijing (CN); Xiaodong Xie, Beijing (CN); Min He, Beijing (CN); Tengfei Zhong, Beijing (CN); Wenjie Xu, Beijing (CN); Xinxiu Zhang, Beijing (CN); Bin Pang, Beijing (CN); Huayu Sang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/768,324

(22) PCT Filed: Apr. 16, 2021

(86) PCT No.: PCT/CN2021/087899
§ 371 (c)(1),
(2) Date: Apr. 12, 2022

(87) PCT Pub. No.: WO2022/217608
PCT Pub. Date: Oct. 20, 2022

(65) Prior Publication Data
US 2024/0105892 A1    Mar. 28, 2024

(51) Int. Cl.
*H10H 20/857* (2025.01)
*H01L 25/075* (2006.01)
*H10H 20/01* (2025.01)

(52) U.S. Cl.
CPC ....... *H10H 20/857* (2025.01); *H01L 25/0753* (2013.01); *H10H 20/0364* (2025.01)

(58) Field of Classification Search
CPC ................. H01L 33/62; H01L 25/0753; H01L 2933/0066; H01L 27/12; G09G 3/32
See application file for complete search history.

(56) References Cited

U.S. PATENT DOCUMENTS

2007/0013076 A1   1/2007  Akiyama
2009/0032955 A1   2/2009  Tanaka et al.
(Continued)

FOREIGN PATENT DOCUMENTS

CN    101359647 A    2/2009
CN    205428907 U    8/2016
(Continued)

*Primary Examiner* — Julia Slutsker
(74) *Attorney, Agent, or Firm* — IPro, PLLC

(57) ABSTRACT

A driving backplane, a manufacturing method thereof, a light-emitting substrate are provided. In the driving backplane, a first conductive layer on a substrate; a first organic film layer is between the first conductive layer and second conductive layer, the first organic film layer has first via holes; a first inorganic film layer is on one side of first organic film layer away from the substrate; the second conductive layer is on one side of first inorganic film layer away from first organic film layer, the second conductive layer and the first conductive layer are connected through the first via holes; orthographic projections of the first conductive layer and second conductive layer have an overlapping region, the overlapping region includes a region including orthographic projection of the first via holes, and a first region, an orthographic projection of the first inorganic film layer covers parts of the first region.

19 Claims, 6 Drawing Sheets

(56) References Cited

U.S. PATENT DOCUMENTS

| | | | |
|---|---|---|---|
| 2018/0032204 A1* | 2/2018 | Imazeki | G06F 3/04164 |
| 2018/0053718 A1 | 2/2018 | Cheng | |
| 2020/0119125 A1 | 4/2020 | Cho et al. | |
| 2020/0312932 A1 | 10/2020 | Kim et al. | |
| 2021/0036029 A1 | 2/2021 | Park et al. | |
| 2021/0249449 A1 | 8/2021 | Cai et al. | |
| 2022/0302201 A1* | 9/2022 | Chang | H01L 25/0756 |

FOREIGN PATENT DOCUMENTS

| | | |
|---|---|---|
| CN | 107664887 A | 2/2018 |
| CN | 111048506 A | 4/2020 |
| CN | 111755479 A | 10/2020 |
| CN | 112331681 A | 2/2021 |
| CN | 112397550 A | 2/2021 |

* cited by examiner

DRIVING BACKPLANE, MANUFACTURING METHOD THEREOF, AND LIGHT-EMITTING SUBSTRATE

CROSS-REFERENCE TO RELATED APPLICATIONS

This application is a National Stage of International Application No. PCT/CN2021/087899, filed Apr. 16, 2021, which is hereby incorporated by reference in its entirety.

FIELD

The present disclosure relates to the technical field of display devices, and in particular to a driving backplane, a manufacturing method thereof, and a light-emitting substrate.

BACKGROUND

In the related art, miniature light-emitting diode display (Mini LED and Micro LED) has excellent performances such as low power consumption, fast response, long life, high color saturation and contrast. With technological breakthroughs, a miniature light-emitting diode will become a next generation display technology after liquid crystal display and organic electroluminescence display. With popularization of 4K ultra-high definition in the 5G era, it is expected that a miniature light-emitting diode display panel will accelerate the replacement of a traditional panel, the penetration rate is accelerate, and the market potential is huge.

SUMMARY

The present disclosure provides the following technical solutions.

A driving backplane, including a substrate, a first conductive layer, a first organic film layer, a first inorganic film layer, and a second conductive layer, wherein:
  the first conductive layer is formed on the substrate;
  the first organic film layer is formed between the first conductive layer and the second conductive layer, and the first organic film layer is provided with a plurality of first via holes;
  the first inorganic film layer is formed on one side of the first organic film layer away from the substrate;
  the second conductive layer is formed on one side of the first inorganic film layer away from the first organic film layer, and the second conductive layer and the first conductive layer are conductively connected through the first via holes; and
  an orthographic projection of the first conductive layer on the substrate and an orthographic projection of the second conductive layer on the substrate have an overlapping region, and the overlapping region includes a region where an orthographic projection of the first via holes on the substrate is located and a first region, and an orthographic projection of the first inorganic film layer on the substrate covers at least part of the first region.

Optionally, the orthographic projection of the first inorganic film layer on the substrate only does not overlap with the orthographic projection of the first via holes on the substrate.

Optionally, a pattern of the orthographic projection of the first inorganic film layer on the substrate is identical to a pattern of the orthographic projection of the second conductive layer on the substrate, wherein:
  a pattern of the second conductive layer has a wiring segment, a connection segment and a redundant segment, the redundant segment is parallel to the wiring segment and is arrayed in a first direction, the redundant segment and the wiring segment extend in a second direction, the second direction is perpendicular to the first direction, one end of the connection segment is connected with the wiring segment, and other end is connected with the first conductive layer through the first via holes; and
  a pattern of the first inorganic film layer has a first pattern part same as the wiring segment in pattern, a second pattern part same as the redundant segment in pattern, and a third pattern part same as the connection segment in pattern, an orthographic projection of the second pattern part on the substrate is located in an orthographic projection of the wiring segment on the substrate, and an orthographic projection of the third pattern part on the substrate does not overlap with the orthographic projection of the first via holes on the substrate.

Optionally, the connection segment includes a first connection part and a second connection part extending in the second direction, and a third connection part connecting the first connection part with the second connection part, the first connection part and the second connection part are arrayed in the first direction, the first connection part, the second connection part and the third connection part cooperate to form an avoidance region, the third pattern part has a via hole avoidance region same as the avoidance region in pattern, and an orthographic projection of the via hole avoidance region on the substrate covers the orthographic projection of the first via holes on the substrate.

Optionally, the orthographic projection of the first inorganic film layer on the substrate covers a take-up region of the substrate, and does not overlap with a gold finger region of the take-up region.

Optionally, the driving backplane further includes a second inorganic film layer, and the second inorganic film layer is located between the first conductive layer and the first organic film layer.

Optionally, the first organic film layer includes at least two sub-organic film layers superimposed in a thickness direction of the substrate.

Optionally, an orthographic projection of at least one of the at least two sub-organic film layers on the substrate covers the gold finger region of the take-up region of the substrate, and the orthographic projection of at least one of the at least two the sub-organic film layers on the substrate does not overlap with the gold finger region of the take-up region of the substrate.

The present disclosure further provides a light-emitting substrate, including any driving backplane provided in the above technical solution, and a plurality of light-emitting diodes fixed on the driving backplane.

The present disclosure further provides a manufacturing method of the above any driving backplane, including:
  forming a pattern of a first conductive layer on a substrate;
  forming a first organic film layer on one side of the first conductive layer away from the substrate, and patterning the first organic film layer to obtain a plurality of first via holes;
  forming a pattern of a first inorganic film layer on one side of the first organic film layer away from the first conductive layer;

forming a pattern of a second conductive layer on one side of the first inorganic film layer away from the first organic film layer, and the pattern of the second conductive layer and the pattern of the first conductive layer being conductively connected through the first via holes; wherein, an orthographic projection of the first conductive layer on the substrate and an orthographic projection of the second conductive layer on the substrate have an overlapping region, and the overlapping region includes a region where an orthographic projection of the first via holes on the substrate is located and a first region, and an orthographic projection of the first inorganic film layer on the substrate covers at least part of the first region.

Optionally, the forming the pattern of the first inorganic film layer on one side of the first organic film layer away from the first conductive layer, includes:

forming an inorganic material layer on one side of the first organic film layer away from the first conductive layer;

forming a first photoresist layer on one side of the inorganic material layer away from the first organic film layer;

patterning the first photoresist layer to obtain a pattern of the first photoresist layer consistent with a pattern of the first inorganic film layer; and taking the pattern of the first photoresist layer as a shield to form the pattern of the first inorganic film layer by adopting a dry etching process, wherein an orthographic projection of the pattern of the first inorganic film layer on the substrate does not overlap with the orthographic projection of the first via holes on the substrate.

Optionally, the forming the pattern of the first inorganic film layer on one side of the first organic film layer away from the first conductive layer, includes:

providing a mask; wherein the mask includes a first alignment mark and a second alignment mark, the first alignment mark is configured to cooperate with a part of the alignment mark on a substrate to form a first alignment mark pair, and the second alignment mark is configured to cooperate with another part of the alignment mark on the substrate to form a second alignment mark pair;

forming an inorganic material layer on one side of the first organic film layer away from the first conductive layer;

forming a first photoresist layer on one side of the inorganic material layer away from the first organic film layer, and adopting the first alignment mark pair to align the mask with the substrate;

patterning the first photoresist layer to obtain a pattern of the first photoresist layer consistent with a to-be-formed pattern of the first inorganic film layer; and taking the pattern of the first photoresist layer as a shield to form the pattern of the first inorganic film layer by adopting a dry etching process.

The forming the pattern of the second conductive layer on one side of the first inorganic film layer away from the first organic film layer, includes:

forming a second photoresist layer on the first inorganic film layer by adopting a photoresist material with the photosensitivity same as a photosensitivity of the first photoresist layer;

adopting the second alignment mark pair to align the mask used during of forming the pattern of the first inorganic film layer and the substrate;

patterning the second photoresist layer;

taking a pattern of the second photoresist layer as a shield to form the pattern of the second conductive layer; wherein, the pattern of the second conductive layer has a wiring segment, a connection segment and a redundant segment, the redundant segment is parallel to the wiring segment and is arrayed in a first direction, the redundant segment and the wiring segment extend in a second direction, the second direction is perpendicular to the first direction, one end of the connection segment is connected with the wiring segment, and the other end is connected with the first conductive layer through the first via holes; and the pattern of the first inorganic film layer has a first pattern part same as the wiring segment in pattern, a second pattern part same as the redundant segment in pattern, and a third pattern part same as the connection segment in pattern, an orthographic projection of the second pattern part on the substrate is located in an orthographic projection of the wiring segment on the substrate, and an orthographic projection of the third pattern part on the substrate does not overlap with the orthographic projection of the first via holes on the substrate.

Optionally, before the forming the inorganic material layer on one side of the first organic film layer away from the first conductive layer, the manufacturing method includes:

adopting a baffle to shield a region of the first organic film layer corresponding to the gold finger region on the substrate.

DETAILED DESCRIPTION OF THE EMBODIMENTS

Figure 1:
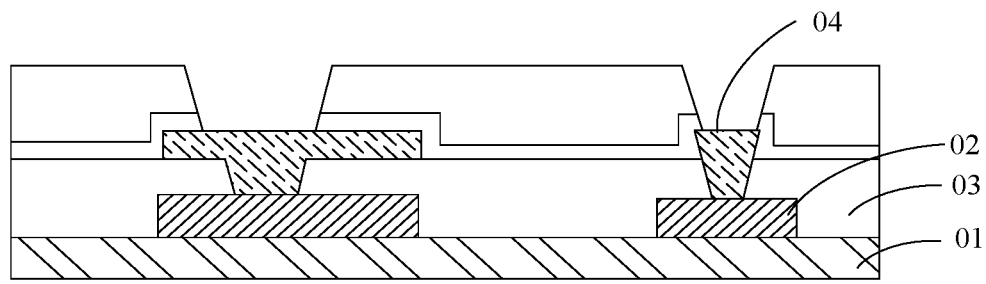
FIG. 1 is a schematic structural diagram of a driving backplane in the related art.

In the related art, in order to further improve performance of a miniature light-emitting diode, it is necessary to reduce a driving resistance of a driving backplane. FIG. 1 is a schematic structural diagram of a driving backplane in the related art. The driving backplane includes a substrate 01, a first conductive layer 02, a first organic film layer 03, and a second conductive layer 04. The second conductive layer 04 is electrically connected with the first conductive layer 02 through via holes. However, for the driving backplane with the above structure, after an actual product is fabricated, it is found that there is a problem of short circuit in a region where a connection wiring in the second conductive layer and a connection wiring of the first conductive layer overlap, resulting in abnormal display, for example, the occurrence of problems such as display black dots. The research found that there are two reasons for the short circuit.

(1) The position where a wiring voltage in the second conductive layer is high overlaps with the wiring in the first conductive layer, the second conductive layer is electrochemically corroded, and the first organic film layer cannot prevent the second conductive layer from growing toward the first conductive layer, causing the wiring in the second conductive layer to contact with the wiring in the first conductive layer, thereby causing the short circuit of the wiring in the second conductive layer and the wiring in the first conductive layer.

(2) There are particles in the region where the wiring in the first conductive layer and the wiring in the second conductive layer overlap, and the particles may extrude the first organic film layer, resulting in the short circuit of the wiring in the first conductive layer and the wiring in the second conductive layer.

Based on this, embodiments of the present disclosure provide a driving backplane, a manufacturing method thereof and a display panel.

Figure 2:
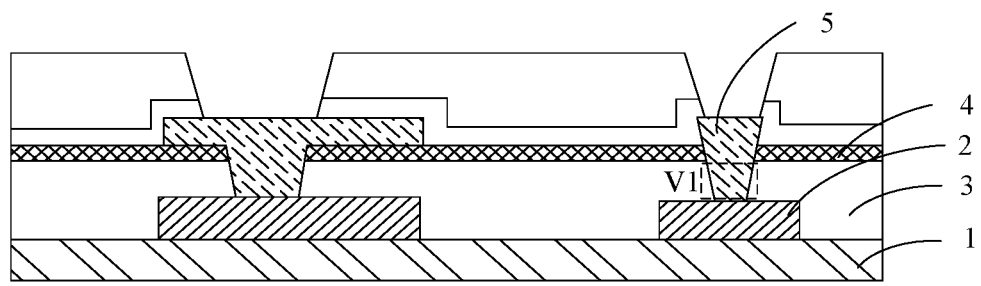
FIG. 2 is a schematic structural diagram of a driving backplane provided by an embodiment of the present disclosure.

FIG. 2 is a schematic structural diagram of a driving backplane provided by an embodiment of the present disclosure. As shown in FIG. 2, a driving backplane provided by the embodiment of the present disclosure may include:

a driving backplane, including a substrate 1, a first conductive layer 2, a first organic film layer 3, a first inorganic film layer 4, and a second conductive layer 5, wherein:
the first conductive layer 2 is formed on the substrate 1;
the first organic film layer 3 is formed between the first conductive layer 2 and the second conductive layer 5, and the first organic film layer 3 is provided with a plurality of first via holes V1;
the first inorganic film layer 4 is formed on the side of the first organic film layer 3 away from the substrate 1;
the second conductive layer 5 is formed on the side of the first inorganic film layer 4 away from the first organic film layer 3, and the second conductive layer 5 and the first conductive layer 2 are conductively connected through the first via holes V1; and an orthographic projection of the first conductive layer 2 on the substrate 1 and an orthographic projection of the second conductive layer 5 on the substrate 1 have an overlapping region, and the overlapping region includes a region where an orthographic projection of the first via holes V1 on the substrate 1 is located and a first region, and an orthographic projection of the first inorganic film layer 4 on the substrate 1 covers at least part of the first region.

The driving backplane provided by an embodiment of the present disclosure, includes the substrate 1, the first conductive layer 2, the first organic film layer 3, the first inorganic film layer 4, and the second conductive layer 5. The first inorganic film layer 4 is formed between the second conductive layer 5 and the first organic film layer 3, wherein the orthographic projection of the first conductive layer 2 on the substrate 1 and the orthographic projection of the second conductive layer 5 on the substrate 1 have the overlapping region, the overlapping region includes the region where the orthographic projection of the first via holes V1 on the substrate 1 is located and the first region, and the orthographic projection of the first inorganic film layer 4 on the substrate 1 covers the at least part of the first region. The first region may be an overlapping region between a wiring of the second conductive layer 5 and a wiring of the first conductive layer 2. Due to the higher density and higher hardness of an inorganic material than an organic material, the first inorganic film layer 4 between the first organic film layer 3 and the second conductive layer 5 can prevent the position where a wiring voltage in the second conductive layer 5 is high grows toward the first conductive layer 2 and improve pushing of particles in the first conductive layer 2, thereby avoiding a short circuit of the overlapping region between the wiring of the second conductive layer 5 and the wiring of the first conductive layer 2, and increasing a product yield.

Figure 3:
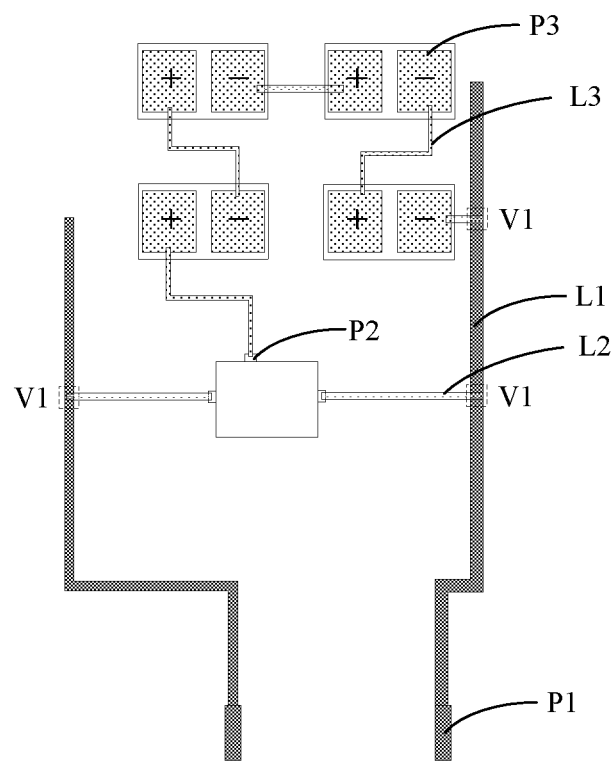
FIG. 3 is a schematic diagram of a planar structure of a driving backplane provided by an embodiment of the present disclosure.

FIG. 3 is a schematic diagram of a planar structure of a driving backplane in an embodiment of the present disclosure. As shown in FIG. 3, the first conductive layer 2 may include: a plurality of binding electrodes P1 and a plurality of first connection wirings L1, and a second conductive layer 5 may include: a plurality of driving electrodes P2, a plurality of connection electrodes P3, a plurality of second connection wirings L2, and a plurality of third connection wirings L3. The binding electrodes P1 are configured to be connected with a driving chip, the driving electrodes P2 are configured to be electrically connecting with a sub-driving chip, and the connection electrodes P3 are configured to be electrically connected with a light-emitting diode. Optionally, the connection electrodes P3 are divided into a first connection electrode and a second connection electrode, wherein the first connection electrode (the connection electrode marked with "+" in the figure) is configured to be electrically connected with a positive electrode of the light-emitting diode, and the second connection electrode (the connection electrode marked with "−" in the figure) is configured to be electrically with a negative electrode of the light-emitting diode. One ends of the first connection wirings L1 are electrically connected with the binding electrodes P1, the other ends are electrically connected with the second connection wirings L2 through the first via holes V1, and the third connection wirings L3 are configured to connect the first connection electrodes P3 with the second connection electrodes P3, so as to realize series connection between the two light-emitting diodes. It should be noted that a miniature light-emitting diode display panel has a plurality of sub-driving chips, and FIG. 3 only shows a schematic diagram of a group of driving electrodes P2 for being connected with the sub-driving chips.

Figure 4:
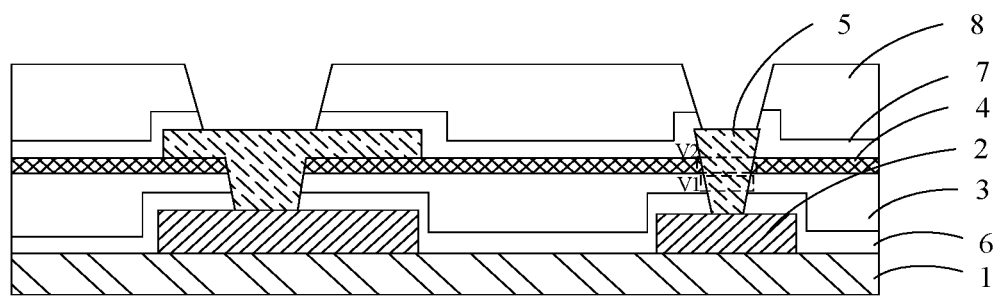
FIG. 4 is a schematic structural diagram of a driving backplane provided by an embodiment of the present disclosure.

The driving backplane provided by the embodiment of the present disclosure, as shown in FIG. 4, may further include: a second inorganic film layer 6 located between the first conductive layer 2 and the first organic film layer 3, a third inorganic film layer 7 located on one side of the second conductive layer 5 facing away from the substrate 1, and a planarization layer 8 located on one side of the third inorganic film layer 7 facing away from the substrate 1.

The second inorganic film layer 6 can prevent the first conductive layer 2 from growing toward the second conductive layer 5, and reduce water vapor, and the second inorganic film layer can improve extrusion of particles in the first conductive layer 2 and avoid the short circuit of the overlapping region between the wiring in the second conductive layer 5 and the wiring in the first conductive layer 2. In addition, the second inorganic film layer 6 is an inorganic dense layer that can isolate the water vapor, and the entire surface of second inorganic film layer 6 can prevent the water vapor from entering the first conductive layer 2, can prevent the water vapor from chemically reacting with the first conductive layer 2, and avoid the short circuit of the overlapping region between the wiring in the first conductive layer 2 and the wiring in the second conductive layer 5 due to growth of the first conductive layer 2. In addition, the second inorganic film layer 6 can enhance the adhesion between the first conductive layer 2 and the first organic film layer 3 and avoid a problem of film layer separation.

Similarly, the third inorganic film layer 7 located between the second conductive layer 5 and the planarization layer 8 also has a function of blocking water vapor and oxygen, thereby further improving sealing performance of the driving backplane. If the planarization layer 8 is manufactured by adopting a high-temperature curing material, in a manufacturing technological process of the planarization layer 8, the third inorganic film layer 7 can prevent the second conductive layer 5 from being oxidized at a high temperature. Optionally, the above first inorganic film layer and second inorganic film layer may be manufactured by adopting inorganic materials such as SiN or SiNO, or other inorganic materials, which is not limited here.

Continuing to refer to FIG. 4, by disposing the planarization layer 8 on one side of the second conductive layer 5 facing away from a base plate of the substrate 1, the driving backplane can be protected and flattened. A second via hole V2 corresponding to the first via holes V1 is formed in the first inorganic film layer 4, so that the first conductive layer 2 can be electrically connected with the second conductive layer 5 through the first via holes V1 and the second via hole V2.

It should be noted that a structure shown in FIG. 3 is taken as an example in the embodiment of the present disclosure to illustrate structures of the first conductive layer 2 and the second conductive layer 5. During specific implementation, the first conductive layer 2 and the second conductive layer 5 may also include other structures, which is not limited here. Furthermore, in FIG. 3, in order to illustrate a connection relationship between the first conductive layer 2 and the second conductive layer 5, a pattern of the first conductive layer 2 and a pattern of the second conductive layer 5 are placed in the same plan view for illustration. Actually, the first conductive layer 2 and the second conductive layer 5 are stacked, and the first conductive layer 2 and the second conductive layer 5 are electrically connected through the first via holes V1 in the first organic film layer 3.

During specific implementation, in order to improve the performance of the driving backplane and reduce the driving resistance of the driving backplane, a thickness of the first conductive layer 2 may be set to be greater than 7 μm so as to reduce a sheet resistance of the first conductive layer 2. Furthermore, the first conductive layer 2 may be manufactured by adopting a material with good electrical conductivity. For example, the first conductive layer 2 may be manufactured by adopting a metal material (such as metal copper), or other materials with the good electrical conductivity, which is not limited here. Since a length of a connection line in the second conductive layer 5 is short, a thickness of the second conductive layer 5 may be set to be smaller than a thickness of the first conductive layer 2. For example, the thickness of the second conductive layer 5 may be set to be about thousands of angstroms, furthermore, the second conductive layer 5 may also be manufactured by adopting a metal material (such as metal copper) with good electrical conductivity, or other materials with the good electrical conductivity, which is not limited here.

In a possible implementation, a pattern of the first inorganic film layer 4 may be set as that the orthographic projection of the first inorganic film layer on the substrate does not overlap with the orthographic projection of the first via holes on the substrate, to avoid a region where the first via holes are located, so that the first inorganic film layer is provided at the overlapping position of the wiring of the first conductive layer and the wiring of the second conductive layer. Optionally, it may be set that the entire layer of the first inorganic film layer 4 covers under the second conductive layer 5 except for the region of the first via holes V1, which can prevent the position where the wiring voltage of the second conductive layer 5 is high from growing toward the first conductive layer 2, reduce water vapor, improve extrusion of particles in the first conductive layer 2, and avoid the short circuit of the overlapping region between the wiring in the second conductive layer 5 and the wiring in the first conductive layer 2. In addition, a material of the first organic film layer 3 is an organic polymer, there are tiny pores in the film layer, and water vapor can enter. In a process of manufacturing the driving backplane, there will be industries such as water washing, development, and etching, entering of the water vapor will be caused, and water vapor in the environment may also enter the first organic film layer 3, which will aggravate the occurrence of the short circuit of the overlapping region between the wiring in the second conductive layer 5 and the wiring in the first conductive layer 2. However, the first inorganic film layer 4 is an inorganic dense layer that can isolate water vapor, the entire surface of first inorganic film layer 4 can prevent the water vapor from entering the first organic film layer on the lower layer, can prevent the water vapor from chemically reacting with the first conductive layer 2, and avoid the short circuit of the overlapping region between the wiring in the first conductive layer 2 and the wiring in the second conductive layer 5 due to growth of the first conductive layer 2. In addition, the metal material and the organic material have poor bonding force. With the subsequent high temperature process, the second conductive layer 5 and the first organic film layer 3 may be separated from each other, resulting in abnormal products. While the first inorganic film layer 4 is formed between the second conductive layer 5 and the first organic film layer 3, thereby enhancing the adhesion between the second conductive layer 5 and the first organic film layer 3 and avoiding the problem of film layer separation.

In another possible implementation, the pattern of the first inorganic film layer 4 may also be disposed only under the wiring in the second conductive layer 5, and when the pattern of the first inorganic film layer 4 and the pattern of the second conductive layer 5 are manufactured to be completely overlapped, this structure can be obtained, so that the region where the wiring in the second conductive layer 5 and the wiring in the first conductive layer 2 overlap has the first inorganic film layer 4, the first inorganic film layer 4 can block the second conductive layer 5 from growing toward the first conductive layer 2, can effectively prevent the particles in the first conductive layer 2 from pressing the first organic film layer, and reduce a probability of the short circuit of the overlapping region between the wiring in the first conductive layer 2 and the wiring in the second conductive layer 5. When manufacturing such a structure, the first inorganic film layer 4 and the second conductive layer 5 may share one mask, which can save the production cost. However, when the pattern of the first inorganic film layer 4 and the pattern of the second conductive layer 5 are manufactured to be completely overlapped, a region where the pattern of the first conductive layer 2 and the pattern of the second conductive layer 5 are in lap joint through the first via holes V1 also has the first inorganic film layer 4, which will cause the second conductive layer 5 and the first conductive layer 2 to be unable to be in lap joint. Therefore, when only disposing the pattern of the first inorganic film layer 4 under the pattern of the second conductive layer 5, it is necessary to avoid the region where the first conductive layer 2 and the second conductive layer 5 are in lap joint through a first through hole, so that the first conductive layer 2 and the second conductive layer 5 can be in lap joint. For example, positions that need to be avoided mainly include a lap joint region of the second connection wirings L2 connected with the connection electrodes P3 and the first connection wirings L1, and a region where the driving electrodes P2 are in lap joint with the first connection wirings L1. The first connection wirings L1 may include a power line (POWER), a ground wire (GND), a driving signal line, and the like.

In order to solve a problem that the first conductive layer 2 and the second conductive layer 5 cannot be in lap joint at the through holes, an implementation of another driving backplane is provided in an embodiment of the present disclosure.

Figure 5:
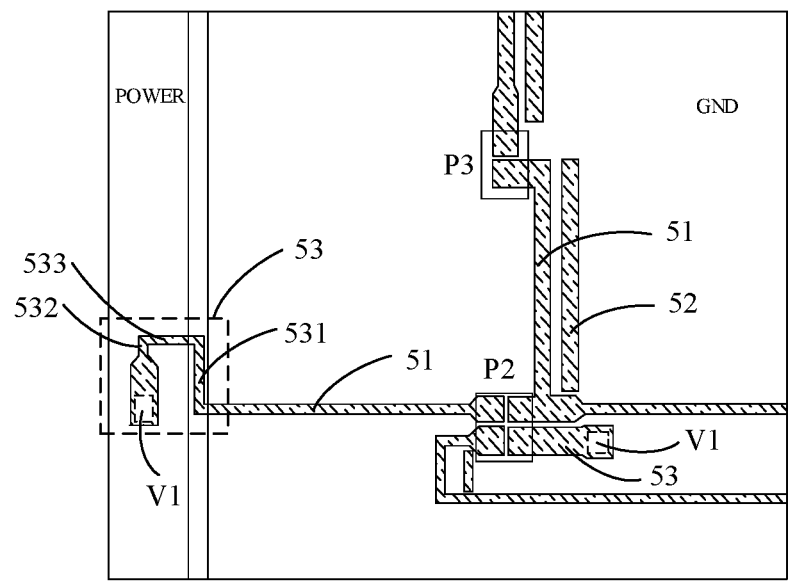
FIG. 5 is a schematic structural diagram of a second conductive layer provided by an embodiment of the present disclosure.
Figure 6:
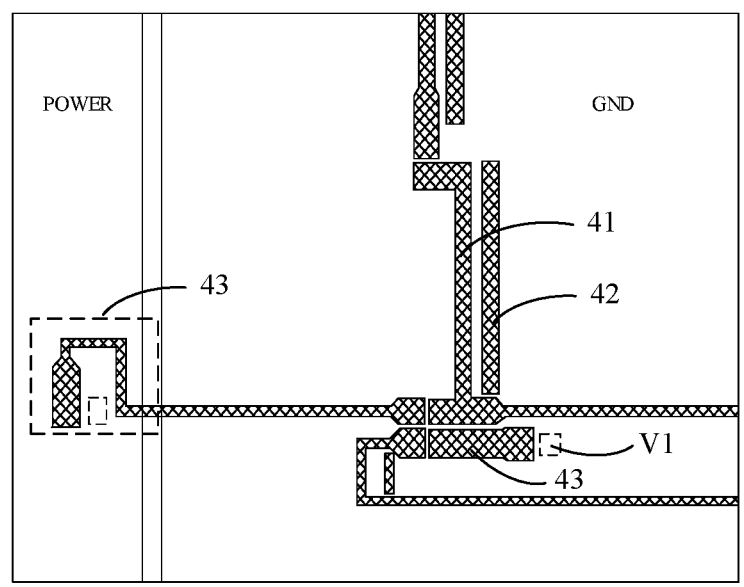
FIG. 6 is a structural diagram of a first inorganic film layer provided by an embodiment of the present disclosure.

FIG. 5 is a schematic diagram of a planar structure of a second conductive layer provided by an embodiment of the present disclosure, which mainly shows the design of the overlapping position between a driving electrode P2 and a power line (POWER) and a ground wire (GND) in a first connection wiring L1. FIG. 6 is a schematic diagram of a planar structure of a first inorganic film layer in the present disclosure. As shown in FIG. 5 and FIG. 6, a pattern of an orthographic projection of the first inorganic film layer 4 on a substrate 1 is the same as a pattern of an orthographic projection of a second conductive layer 5 on the substrate 1.

As shown in FIG. 5, the pattern of the second conductive layer 5 has a wiring segment 51, a connection segment 53 and a redundant segment 52, the redundant segment 52 and the wiring segment 51 are parallel and are arrayed in a first direction, the redundant segment 52 and the wiring segment 51 extend in a second direction, the second direction is perpendicular to the first direction, one end of the connection segment 53 may be connected with the wiring segment 51, and the other end is connected with the first conductive layer 2 through first via holes V1. It should be noted that the situation here that one end of the connection segment 53 is connected with the wiring segment 51, and the other end is connected with the first conductive layer through the first via holes V1 means that some of the wiring segment is connected with the connection segment, not all the wiring segments are connected with the connection segment.

Figure 7:
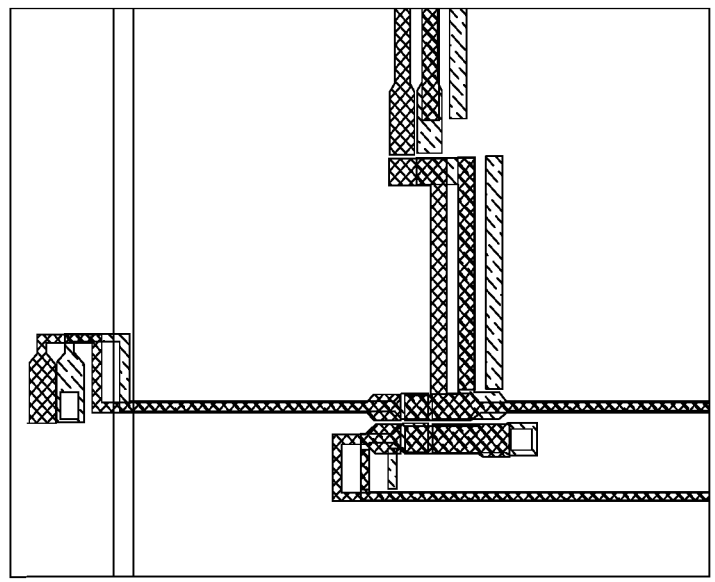
FIG. 7 is a planar structure diagram of another driving substrate provided by an embodiment of the present disclosure.

As shown in FIG. 6, a pattern of the first inorganic film layer 4 has a first pattern part 41 same as the wiring segment 51 in pattern, a second pattern part 42 same as the redundant segment 52 in pattern, and a third pattern part 43 same as the connection segment 53 in pattern. As shown in FIG. 7, an orthographic projection of the second pattern part 42 on the substrate 1 is located in an orthographic projection of the wiring segment 51 on the substrate 1, and an orthographic projection of the third pattern part 43 on the substrate 1 does not overlap with the orthographic projection of the first via holes V1 on the substrate 1.

In the driving backplane provided by the above embodiment of the invention, the first inorganic film layer 4 and the second conductive layer 5 may be manufactured through the same mask, so that a pattern of the orthographic projection of the first inorganic film layer 4 on the substrate 1 and a pattern of the orthographic projection of the second conductive layer 5 on the substrate 1 are the same. Because the second conductive layer 5 is provided with the redundant segment 52 parallel to the wiring segment 51 and arrayed in a first direction, when the mask for manufacturing the second conductive layer 5 is used for manufacturing the first inorganic film layer 4, a solution that the mask is offset and exposed in the first direction may be adopted, so that the pattern of the first inorganic film layer 4 is offset by a size of an interval between the wiring segment 51 and the redundant segment 52 relative to the pattern of the second conductive layer 5 in the first direction. A third pattern part 43 of the first inorganic film layer 4 avoids a region corresponding to the first via holes V1, and obtains a second pattern part 42 same as the redundant segment 52 in the second conductive layer 5 in pattern, while when the second conductive layer 5 is manufactured by utilizing the same mask, the wiring segment 51 may be manufactured above the second pattern part 42, so that there is the pattern of the second inorganic film layer 4 between the wiring segment 51 of the second conductive layer and the first conductive layer 2, and there is no pattern of the first inorganic film layer in the region corresponding to the first via holes V1. The pattern design of the above second conductive layer 5 and the first inorganic film layer 4 can be manufactured by the same mask, which can save the production costs, and can make the first conductive layer 2 and the second conductive layer 5 are in lap joint at the first via holes V1. In addition, the redundant segment 52 may be set as a backup structure for the wiring segment 51. A pattern of the redundant segment 52 is the same as that of the wiring segment 51. When the wiring segment 51 is abnormal, the redundant segment 52 may be made to replace the wiring segment 51 to be connected with other lines to repair the driving backplane.

As shown in FIG. 5, the above connection segment 53 may specifically include a first connection part 531 and a second connection part 532 extending in the second direction, and a third connection part 533 connecting the first connection part 531 with the second connection part 532, the first connection part 531 and the second connection part 532 are arrayed in the first direction, and the first connection part 531, the second connection part 532 and the third connection part 533 cooperate to form an avoidance region. As shown in FIG. 6, the third pattern part 43 has a via hole avoidance region same as the avoidance region in pattern, and an orthographic projection of the via hole avoidance region on the substrate 1 covers the orthographic projection of the first via holes V1 on the substrate 1.

In the above connection segment 53, the first connection part 531 may be connected with the wiring segment 51, and the third connection part 533 may be connected with the first conductive layer 2 through the first via holes V1. Since the first connection part 531 and the second connection part 532 both extend in the second direction and are arrayed in the first direction, the first connection part 531, the second connection part 532 and the third connection part 533 are surrounded to form the avoidance region. When the mask for manufacturing the second conductive layer 5 is used for offsetting and exposing in the first direction to manufacture the first inorganic film layer 4, the obtained third pattern part also has the via hole avoidance region, and an orthographic projection of the via hole avoidance region on the substrate 1 covers the orthographic projection of the first via holes V1 on the substrate 1, that is, the first inorganic film layer 4 may be made to avoid the first via holes V1 to ensure that the region where the first via holes V1 are located is not covered by the first inorganic film layer 4, so that the first conductive layer 2 and the second conductive layer 5 are electrically connected through the first via holes V1.

Figure 8:
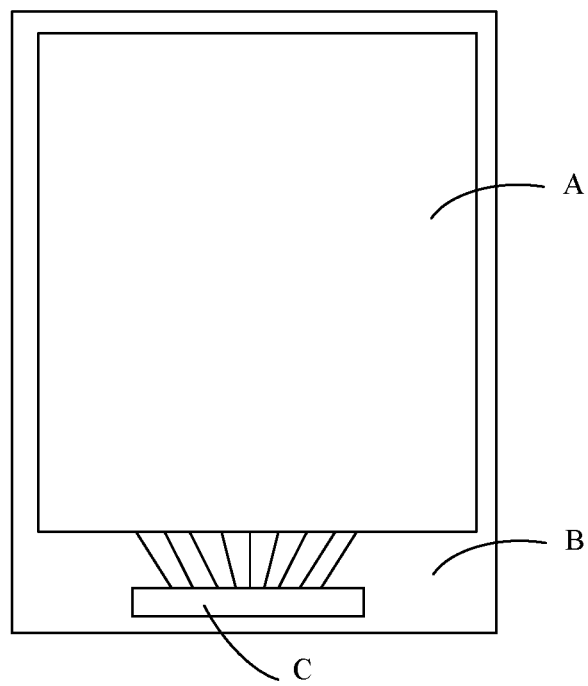
FIG. 8 is a partition diagram of a substrate provided by an embodiment of the present disclosure.

As shown in FIG. 8, the driving backplane may include a display region A and a take-up region B, and the take-up region B has a gold finger region C, wherein the gold finger region C may be configured to set a binding electrode P1.

It should be noted that the first inorganic film layer 4 is manufactured by offset and exposure of the mask for manufacturing the second conductive layer 5 in the first direction. Due to the offset of the mask, the above situation that the pattern of the orthographic projection of the first inorganic film 4 on the substrate 1 is the same as the pattern of the orthographic projection of the second conductive layer 5 on the substrate 1 mainly means that the pattern of the orthographic projection of the first inorganic film layer 4 on the substrate 1 is mostly the same as the pattern of the orthographic projection of the second conductive layer 5 on the substrate 1, and missing of part of the pattern in the first inorganic film layer 4 may be allowed. For example, in offset manufacturing, the part of pattern at the edge may be missing.

In the above driving substrate, the take-up region B is a place where an overlapping area of the first conductive layer 2 and the second conductive layer 5 is densest and cannot be avoided in the entire driving backplane. If in the entire driving backplane, the ratio of the overlapping area of the first conductive layer 2 and the second conductive layer 5 in the display region A to the total area of the display region A is 1%, and the ratio that the overlapping area of the take-up area B accounts for a display region A may be as high as 2%; it means that the overlapping area of the first conductive layer 2 and the second conductive layer 5 in the take-up region B is 2 times the overlapping area of the first conductive layer 2 and the second conductive layer 5 in the display region A. At the same time, since after the gold finger region C is bound to a driving chip, the take-up region B is the primary position for transmitting a voltage and a signal to the display region A. If the problem of the short circuit between the wiring of the first conductive layer 2 and the wiring of the second conductive layer 5 is occurred frequently here, product performance will be seriously affected.

Figure 9:
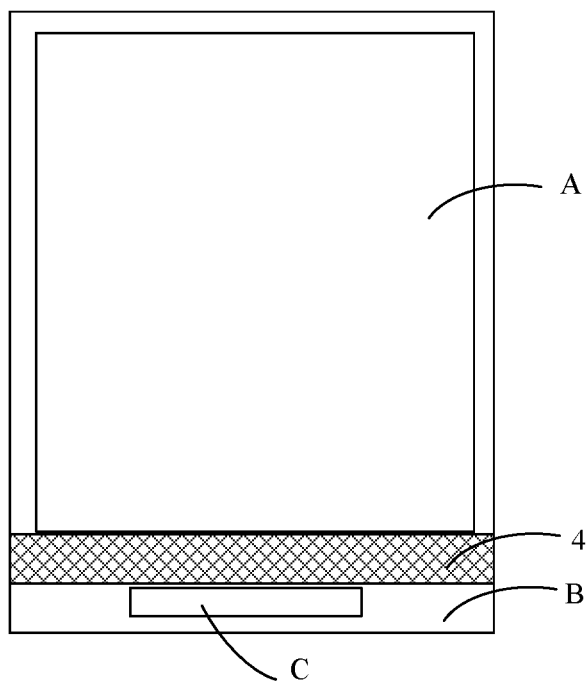
FIG. 9 is a planar structure diagram of another driving backplane provided by an embodiment of the present disclosure.

In another possible implementation, in order to avoid the problem of the short circuit between the wiring of the first conductive layer 2 and the wiring of the second conductive layer in the take-up region B, the orthographic projection of the first inorganic film layer 4 on the substrate 1 may be made to cover the take-up region B of the substrate 1 and does not overlap with the gold finger region C of the take-up region B, as shown in FIG. 9. That is, the first inorganic film layer 4 covers the region, except the gold finger region C, of the take-up region B of the driving backplane, and there is the first inorganic film layer 4 between the first conductive layer 2 and the second conductive layer 5 in the take-up region B, which can prevent the position where the wiring voltage of the second conductive layer 5 of the take-up region B is high from growing toward the first conductive layer 2, improve extrusion of particles in the first conductive layer 2 of the take-up region B, and avoid the short circuit of the overlapping region between the wiring in the second conductive layer 5 and the wiring in the first conductive layer 2. However, the gold finger region C does not cover the first inorganic film layer 4 because the gold finger region C needs to be exposed to ensure connection with the driving chip.

In a possible implementation, the first organic film layer 3 may optionally include at least two sub-organic film layers superimposed in a thickness direction of the substrate 1. It should be noted that materials for manufacturing all the sub-organic film layers may be the same or different, and functions of all the sub-organic film layers may be the same or different. For example, the function of some sub-organic film layers may be to block water and oxygen, or the function of some sub-organic film layers may be to enhance flexibility of the backplane, etc., which is not limited here and depends on the actual situation. A sub-inorganic film layer may be sandwiched between the two adjacent sub-organic film layers to form a multi-layer insulating layer, for example, the sub-organic film layer, the sub-inorganic film layer, the sub-organic film layer, the sub-inorganic film layer . . . are disposed alternatively and cyclically.

It should be noted that because the above first organic film layer, first inorganic film layer and second inorganic film layer are all insulating layers, when the insulating layer reaches a sufficient thickness, the extrusion of the particles in the first conductive layer 2 can be prevented to avoid the short circuit between the first conductive layer and the second conductive layer.

In another possible implementation, among the at least two sub-organic film layers included in the first organic film layer 3, an orthographic projection of the at least one sub-organic film layer on the substrate 1 covers the gold finger region C of the take-up area B of the substrate 1, which can protect the gold finger region C. The orthographic projection of the at least one sub-organic film layer on the substrate 1 does not overlap with the gold finger region C of the take-up region B of the substrate 1, that is, a thickness of the first organic film layer 3 on the gold finger region C may be set to be smaller than a thickness of the first organic film layer 3 on the display region A, and the gold finger region C of the take-up region B may be made thinner, thereby reducing a thickness of the take-up region B of the driving backplane, and facilitating binding of the gold finger region C to the driving chip. Optionally, a thickness of the first sub-organic film layer adjacent to the substrate 1 may be smaller than a thickness of the sub-organic film layers of other second inorganic film layers, and only the first sub-organic film layer adjacent to the substrate 1 may be disposed in the gold finger region C, thereby making the first organic film layer of the gold finger region C be thinner, and facilitating binding of the gold finger region C to the driving chip.

Based on the same inventive concept, an embodiment of the present disclosure further provides a light-emitting substrate, which may include: any above driving backplane, and a plurality of light-emitting diodes fixed on the driving backplane. Principles of the light-emitting substrate for solving the problems are similar to that of the above driving backplane, therefore, implementation of the light-emitting substrate may refer to that of the above driving backplane, and repetitions are omitted. The above light-emitting diodes may be miniature light-emitting diodes (Mini LED and Micro LED). All the light-emitting diodes are controlled by the driving backplane to emit light, and thus image display can be realized. The light-emitting substrate may be a backlight substrate or a display panel.

Based on the same inventive concept, an embodiment of the present disclosure further provides a manufacturing method of any above driving backplane. Principles of the manufacturing method for solving the problems are similar to that of the above driving backplane, therefore, implementation of the manufacturing method may refer to that of the above driving backplane, and repetitions are omitted.

Figure 10:
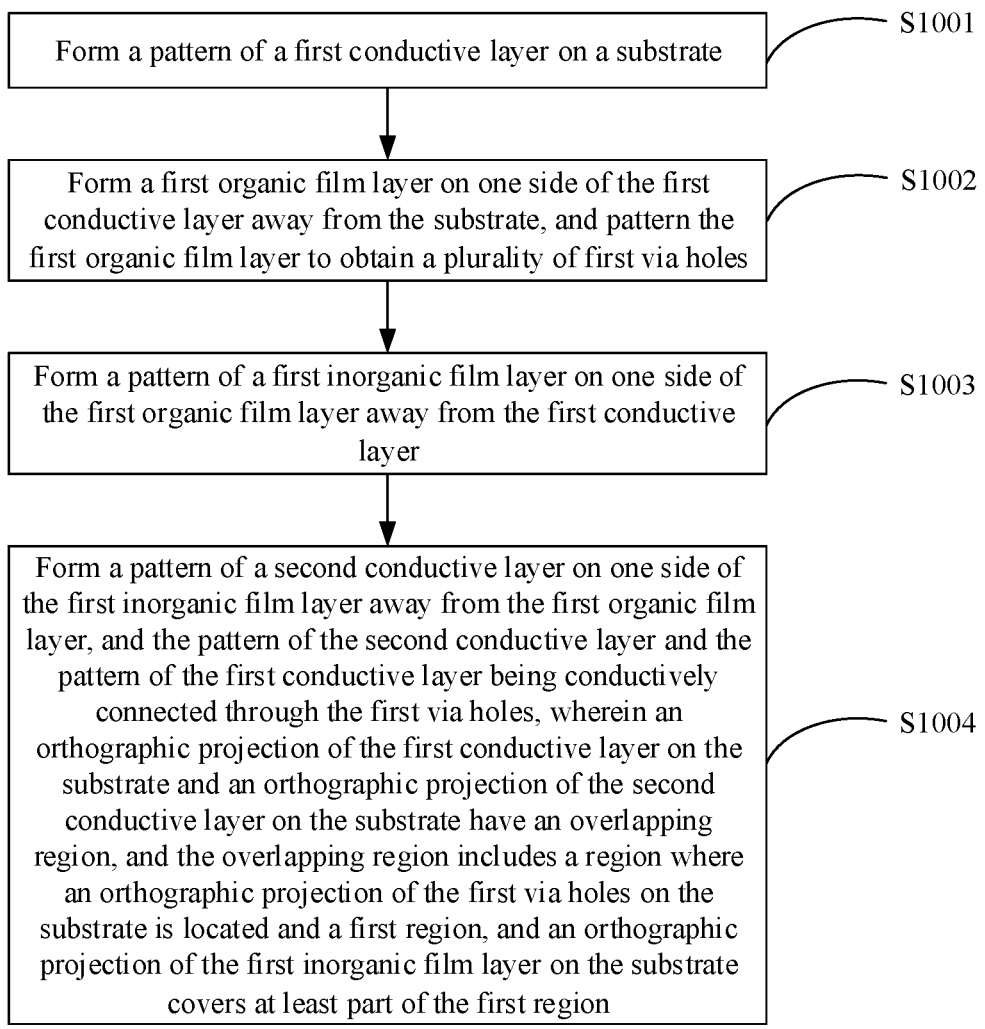
FIG. 10 is a manufacturing flow diagram of a driving backplane provided by an embodiment of the present disclosure.

The manufacturing method of any above driving backplane provided by the embodiment of the present disclosure, as shown in FIG. 10, may include:

S1001: a pattern of a first conductive layer is formed on a substrate, and the first conductive layer may be formed by multiple depositions or one deposition;

S1002: a first organic film layer is formed on one side of the first conductive layer away from the substrate, and the first organic film layer is patterned to obtain a plurality of first via holes;

S1003: a pattern of a first inorganic film layer is formed on one side of the first organic film layer away from the first conductive layer; and S1004: a pattern of a second conductive layer is formed on one side of the first inorganic film layer away from the first organic film layer, and the pattern of the second conductive layer and the pattern of the first conductive layer are conductively connected through first via holes, wherein an orthographic projection of the first conductive layer on the substrate and an orthographic projection of the second conductive layer on the substrate have an overlapping region, and the overlapping region includes a region where an orthographic projection of the first via holes on the substrate is located and a first region, and an orthographic projection of the first inorganic film layer on the substrate covers at least part of the first region.

The manufacturing method provided by the embodiment of the present disclosure includes forming the first inorganic film layer between the second conductive layer and the first organic film layer, wherein the orthographic projection of the first conductive layer on the substrate and the orthographic projection of the second conductive layer on the substrate have the overlapping region, the overlapping region includes the region where the orthographic projection of the first via holes on the substrate is located and the first region, the orthographic projection of the first inorganic film layer on the substrate covers the at least part of the first region, and the first region may be an overlapping region between a wiring of the second conductive layer and a wiring of the first conductive layer. Due to the higher density and higher hardness of an inorganic material than an organic material, the first inorganic film layer between the first organic film layer and the second conductive layer can prevent a position where a wiring voltage in the second conductive layer is high grows toward the first conductive layer and improve pushing of particles in the first conductive layer, thereby avoiding a short circuit of the overlapping region between the wiring of the second conductive layer and the wiring of the first conductive layer, and increasing a product yield.

In some embodiments of the present disclosure, the pattern of the first inorganic film layer and the pattern of the second conductive layer may be formed at least by adopting the following modes.

Mode 1.

The above step S1003 of forming the pattern of the first inorganic film layer on one side of the first organic film layer away from the first conductive layer may specifically include:

S1101: an inorganic material layer is formed on one side of the first organic film layer away from the first conductive layer; and a material of the inorganic material layer may be SiN or SiNO, etc., or other inorganic materials, which is not limited here;

S1102: a first photoresist layer is formed on one side of the inorganic material layer facing away from the first organic film layer;

S1103: the first photoresist layer is patterned to obtain a pattern of the first photoresist layer consistent with a to-be-formed pattern of the first inorganic film layer; and S1104: the pattern of the first photoresist layer is taken as a shield to form the pattern of the first inorganic film layer by adopting a dry etching process, wherein an orthographic projection of the pattern of the first inorganic film layer on the substrate does not overlap with the orthographic projection of the first via holes on the substrate.

It should be noted that during specific implementation, the first photoresist layer may be positive photoresist or negative photoresist, which is not limited here.

In the above process of manufacturing the first inorganic film layer, only a region of the first inorganic film layer corresponding to the first via holes may be etched to form the first inorganic film layer that can cover the entire first organic film layer. The first inorganic film layer obtained by the method is located between the first conductive layer and the second conductive layer, which can prevent a position where a wiring voltage of the second conductive layer is high from growing toward the first conductive layer, improve extrusion of particles of the first conductive layer, and avoid the short circuit of the overlapping region between the wiring in the second conductive layer and the wiring in the first conductive layer. In addition, it can further prevent water vapor from entering the first organic film layer on the lower layer, can prevent a chemical reaction of the water vapor and the first conductive layer, avoid the short circuit of the overlapping region between the wiring in the first conductive layer and the wiring in the second conductive layer due to the growth of the first conductive layer, further more can enhance adhesion between the second conductive layer and the first organic film layer, and avoid a problem of film layer separation.

Mode 2.

Figure 11:
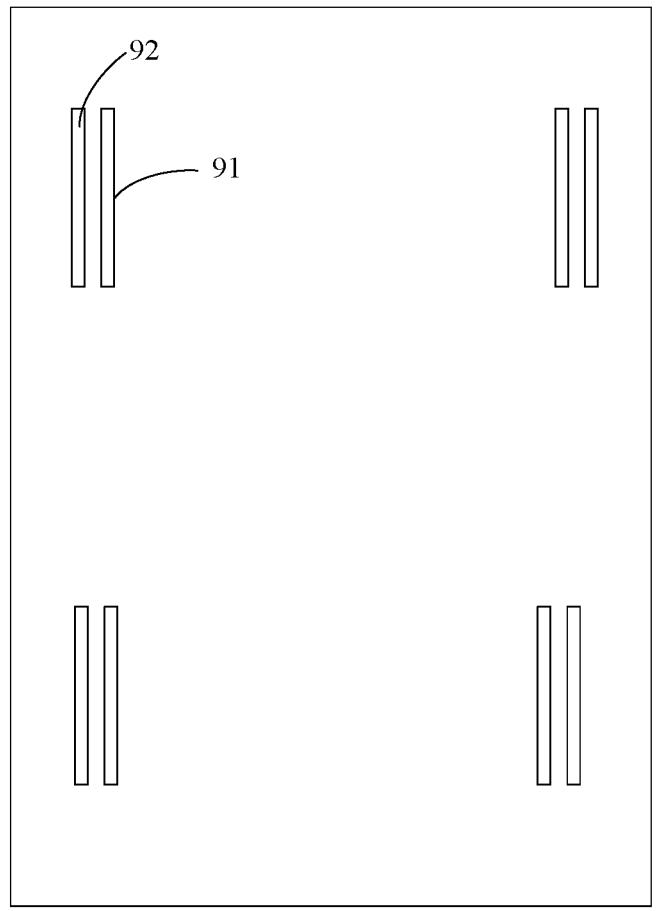
FIG. 11 is a schematic structural diagram of a mask provided by an embodiment of the present disclosure.
Figure 12:
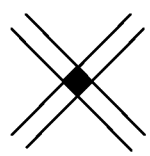
FIG. 12 is a schematic structural diagram of a first alignment mark provided by an embodiment of the present disclosure.
Figure 13:
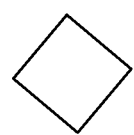
FIG. 13 is a schematic structural diagram of a second alignment mark provided by an embodiment of the present disclosure.

The above step S1003 of forming the pattern of the first inorganic film layer on one side of the first organic film layer away from the first conductive layer may specifically include:

S1201: a mask is provided; the mask includes a first alignment mark 91 and a second alignment mark 92, as shown in FIG. 11, the first alignment mark 91 is configured to cooperate with a part of alignment mark on a to-be-processed substrate to form a first alignment mark pair, and the second alignment mark 92 is configured to cooperate with another part of alignment mark on the to-be-processed substrate to form a second alignment mark pair. Wherein the first alignment mark may add a well-shaped alignment mark to the original alignment mark of the substrate, as shown in FIG. 12, the second alignment mark may add a diamond-shaped alignment mark to the original alignment mark of the substrate, as shown in FIG. 13, a distance between the first alignment mark and the second alignment mark may be designed according to the exposure offset amount of the mask, the first alignment mark and the second alignment mark in FIG. 9 correspond to a non-display region of the substrate, and other patterns of the mask corresponding to the substrate are not drawn in FIG. 9;

S1202: an inorganic material layer is formed on one side of the first organic film layer away from the first conductive layer;

S1203: a first photoresist layer is formed on one side of the inorganic material layer away from the first organic film layer, and the first alignment mark pair is adopted to align the mask with the to-be-processed substrate;

S1204: the first photoresist layer is patterned to obtain a pattern of the first photoresist layer consistent with a to-be-formed pattern of the first inorganic film layer; and S1205: the pattern of the first photoresist layer is taken as a shield to form the pattern of the first inorganic film layer by adopting a dry etching process.

The above step S1004 of forming the pattern of the second conductive layer on one side of the first inorganic film layer away from the first organic film layer, includes:

S1301: a second photoresist layer is formed on the first inorganic film layer by adopting a photoresist material with the same photosensitivity as the first photoresist layer;

S1302: the second alignment mark pair is adopted to align the mask when the pattern of the first inorganic film layer is formed and the substrate;

S1303: the second photoresist layer is patterned; and

S1304: the pattern of second photoresist layer is taken as a shield to form the pattern of the second conductive layer, wherein the pattern of the second conductive layer has a wiring segment, a connection segment and a redundant segment, the redundant segment is parallel to the wiring segment and is arrayed in a first direction, the redundant segment and the wiring segment extend in a second direction, the second direction is perpendicular to the first direction, one end of the connection segment is connected with the wiring segment, and the other end is connected with the first conductive layer through the first via holes; and the pattern of the first inorganic film layer has a first pattern part same as the wiring segment in pattern, a second pattern part same as the redundant segment in pattern, and a third pattern part same as the connection segment in pattern, an orthographic projection of the second pattern part on the substrate is located in an orthographic projection of the wiring segment on the substrate, and an orthographic projection of the third pattern part on the substrate does not overlap with the orthographic projection of the first via holes on the substrate.

In the manufacturing process of the above first inorganic film layer and second conductive layer, the first inorganic film layer and the second conductive layer with the same pattern are formed through the same mask. Because the second conductive layer is provided with the redundant segment parallel to the wiring segment and arrayed in the first direction, the mask for manufacturing the second conductive layer may be used for manufacturing the first inorganic film layer, and a solution that the mask is offset and exposed in the first direction is adopted, so that the pattern of the first inorganic film layer is offset by a size of an interval between the wiring segment and the redundant segment relative to the pattern of the second conductive layer in the first direction, the first inorganic film layer avoids a region corresponding to the first via holes, and the second pattern part same as the redundant segment in the second conductive layer in pattern is obtained, while when the second conductive layer is manufactured by utilizing the same mask, a wiring part may be formed above the second pattern part, so that there is the pattern of the first inorganic film layer between the wiring part of the second conductive layer and the first conductive layer, and there is no pattern of the first inorganic film layer in the region corresponding to the via holes. In the above manufacturing method, the first inorganic film layer and the second conductive layer are manufactured through the same mask, which reduces manufacturing of one mask, and can save the production cost. Furthermore, the first inorganic film layer is not formed in the region corresponding to the first via holes, so that the first conductive layer may be in lap joint with the second conductive layer.

In some embodiments, in the above modes 1 and 2, before step S1003, the method may include:

a baffle is adopted to shield a region of the first organic film layer corresponding to the gold finger region on the substrate.

In the above manufacturing method, the baffle is adopted to shield the region of the first organic film layer corresponding to the gold finger region on the substrate. After the inorganic material layer is formed on one side of the first organic film layer away from the first conductive layer, there may be no inorganic material layer on the region of the first organic film layer corresponding to the gold finger region of the substrate, so that the binding electrodes of the gold finger region can be exposed, so as to facilitate connection with the driving chip.

In some embodiments of the present disclosure, there is also a third mode to form the first inorganic film layer. In mode 3, step S1003 may include:

S1401: a first photoresist layer is formed on one side of the first inorganic film layer facing away from the first organic film layer;

S1402: a baffle is adopted to shield a region of the first photoresist layer corresponding to a take-up region of the substrate;

S1403: the first photoresist layer is directly exposed by an exposure machine to remove the part of the first photoresist layer except the take-up region; and S1404: the pattern of the first photoresist layer is taken as a shield to form the pattern of the first inorganic film layer.

In the manufacturing method provided by the above embodiments of the invention, the first inorganic film layer located between the first conductive layer and the second conductive layer may be formed in the take-up region of a base substrate, which can prevent a position of a wiring voltage of the second conductive layer of the take-up region is high from growing toward the first conductive layer and prevents extrusion of particles in the first conductive layer of the take-up region, so as to avoid the short circuit of the overlapping region between the wiring in the second conductive layer and the wiring in the first conductive layer, and the first inorganic film layer is not covered in the gold finger region because the gold finger region needs to be exposed to ensure connection with the driving chip. In addition, when exposing the first photoresist layer, only one baffle is needed to shield the position of the take-up region except the gold finger region, and no mask needs to be used, which can save the mask and thus save the production cost.

Optionally, in the manufacturing method of the above driving backplane, before step S1002 of forming the first organic film layer on one side of the first conductive layer away from the substrate, the method further includes: a second inorganic film layer is formed on one side of the first conductive layer away from the substrate, wherein the first organic film layer may be a negative photoresist. After exposing the first organic film layer, the pattern of the first organic film layer can be obtained. Then, the pattern of the first organic film layer is taken as the shield, the dry etching process is adopted to form the pattern of the second inorganic film layer, which can reduce one manufacturing procedure, simplify the manufacturing process and save the manufacturing cost.

Although the preferred embodiments of the present disclosure have been described, those skilled in the art can make additional modifications and variations on these embodiments once they know the basic creative concept. Therefore, the appended claim intends to be explained as including the preferred embodiments and all modifications and variations falling within the scope of the present disclosure.

Obviously, those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent art, the present disclosure also intends to include these modifications and variations.

What is claimed is:

1. A driving backplane, comprising a substrate, a first conductive layer, a first organic film layer, a first inorganic film layer, and a second conductive layer, wherein:
    the first conductive layer is formed on the substrate;
    the first organic film layer is formed between the first conductive layer and the second conductive layer, and the first organic film layer is provided with a plurality of first via holes;
    the first inorganic film layer is formed on one side of the first organic film layer away from the substrate;
    the second conductive layer is formed on one side of the first inorganic film layer away from the first organic film layer, and the second conductive layer and the first conductive layer are conductively connected through the first via holes; and
    an orthographic projection of the first conductive layer on the substrate and an orthographic projection of the second conductive layer on the substrate have an overlapping region, and the overlapping region comprises a region where an orthographic projection of the first via holes on the substrate is located and a first region, and an orthographic projection of the first inorganic film layer on the substrate covers at least part of the first region;
    wherein the orthographic projection of the first inorganic film layer on the substrate does not overlap with the orthographic projection of the first via holes on the substrate.

2. The driving backplane according to claim 1, wherein a pattern of the orthographic projection of the first inorganic film layer on the substrate is identical to a pattern of the orthographic projection of the second conductive layer on the substrate, wherein:
    a pattern of the second conductive layer has a wiring segment, a connection segment and a redundant segment, the redundant segment is parallel to the wiring segment and is arrayed in a first direction, the redundant segment and the wiring segment extend in a second direction, the second direction is perpendicular to the first direction, one end of the connection segment is connected with the wiring segment, and other end is connected with the first conductive layer through the first via holes; and
    a pattern of the first inorganic film layer has a first pattern part same as the wiring segment in pattern, a second pattern part same as the redundant segment in pattern, and a third pattern part same as the connection segment in pattern, an orthographic projection of the second pattern part on the substrate is located in an orthographic projection of the wiring segment on the substrate, and an orthographic projection of the third pattern part on the substrate does not overlap with the orthographic projection of the first via holes on the substrate.

3. The driving backplane according to claim 2, wherein the connection segment comprises a first connection part and a second connection part extending in the second direction, and a third connection part connecting the first connection part with the second connection part, the first connection part and the second connection part are arrayed in the first direction, the first connection part, the second connection part and the third connection part cooperate to form an avoidance region, the third pattern part has a via hole avoidance region same as the avoidance region in pattern, and an orthographic projection of the via hole avoidance region on the substrate covers the orthographic projection of the first via holes on the substrate.

4. The driving backplane according to claim 1, wherein the orthographic projection of the first inorganic film layer on the substrate covers a take-up region of the substrate, and does not overlap with a gold finger region of the take-up region.

5. The driving backplane according to claim 1, further comprising a second inorganic film layer, wherein the second inorganic film layer is located between the first conductive layer and the first organic film layer.

6. The driving backplane according to claim 1, wherein the first organic film layer comprises at least two of sub-organic film layers superimposed in a thickness direction of the substrate.

7. The driving backplane according to claim 6, wherein an orthographic projection of at least one of the at least two the sub-organic film layers on the substrate covers the gold finger region of the take-up region of the substrate, and an orthographic projection of at least one of the at least two sub-organic film layers on the substrate does not overlap with the gold finger region of the take-up region of the substrate.

8. A light-emitting substrate, comprising the driving backplane according to claim 1, and a plurality of light-emitting diodes fixed on the driving backplane.

9. A manufacturing method of a driving backplane, comprising:
forming a pattern of a first conductive layer on a substrate;
forming a first organic film layer on one side of the first conductive layer away from the substrate, and patterning the first organic film layer to obtain a plurality of first via holes;
forming a pattern of a first inorganic film layer on one side of the first organic film layer away from the first conductive layer;
forming a pattern of a second conductive layer on one side of the first inorganic film layer away from the first organic film layer, and the pattern of the second conductive layer and the pattern of the first conductive layer being conductively connected through the first via holes; wherein,
an orthographic projection of the first conductive layer on the substrate and an orthographic projection of the second conductive layer on the substrate have an overlapping region, and the overlapping region comprises a region where an orthographic projection of the first via holes on the substrate is located and a first region, and an orthographic projection of the first inorganic film layer on the substrate covers at least part of the first region;
wherein an orthographic projection of the pattern of the first inorganic film layer on the substrate does not overlap with the orthographic projection of the first via holes on the substrate.

10. The manufacturing method according to claim 9, wherein the forming the pattern of the first inorganic film layer on one side of the first organic film layer away from the first conductive layer, comprises:
forming an inorganic material layer on one side of the first organic film layer away from the first conductive layer;
forming a first photoresist layer on one side of the inorganic material layer away from the first organic film layer;
patterning the first photoresist layer to obtain a pattern of the first photoresist layer consistent with a pattern of the first inorganic film layer; and
taking the pattern of the first photoresist layer as a shield to form the pattern of the first inorganic film layer by adopting a dry etching process.

11. The manufacturing method according to claim 9, wherein the forming the pattern of the first inorganic film layer on one side of the first organic film layer away from the first conductive layer, comprises:
providing a mask; wherein the mask comprises a first alignment mark and a second alignment mark, the first alignment mark is configured to cooperate with a part of the alignment mark on a substrate to form a first alignment mark pair, and the second alignment mark is configured to cooperate with another part of the alignment mark on the substrate to form a second alignment mark pair;
forming an inorganic material layer on one side of the first organic film layer away from the first conductive layer;
forming a first photoresist layer on one side of the inorganic material layer away from the first organic film layer, and adopting the first alignment mark pair to align the mask with the substrate;
patterning the first photoresist layer to obtain a pattern of the first photoresist layer consistent with a pattern of the first inorganic film layer; and
taking the pattern of the first photoresist layer as a shield to form the pattern of the first inorganic film layer by adopting a dry etching process; and
the forming the pattern of the second conductive layer on one side of the first inorganic film layer away from the first organic film layer, comprises:
forming a second photoresist layer on the first inorganic film layer by adopting a photoresist material with photosensitivity same as a photosensitivity of the first photoresist layer;
adopting the second alignment mark pair to align the mask used during of forming the pattern of the first inorganic film layer and the substrate;
patterning the second photoresist layer;
taking a pattern of the second photoresist layer as a shield to form the pattern of the second conductive layer; wherein,
the pattern of the second conductive layer has a wiring segment, a connection segment and a redundant segment, the redundant segment is parallel to the wiring segment and is arrayed in a first direction, the redundant segment and the wiring segment extend in a second direction, the second direction is perpendicular to the first direction, one end of the connection segment is connected with the wiring segment, and other end is connected with the first conductive layer through the first via holes; and the pattern of the first inorganic film layer has a first pattern part same as the wiring segment in pattern, a second pattern part same as the redundant segment in pattern, and a third pattern part same as the connection segment in pattern, an orthographic projection of the second pattern part on the substrate is located in an orthographic projection of the wiring segment on the substrate, and an orthographic projection of the third pattern part on the substrate does not overlap with the orthographic projection of the first via holes on the substrate.

12. The manufacturing method according to claim 10, wherein before the forming the inorganic material layer on one side of the first organic film layer away from the first conductive layer, the manufacturing method comprises:
adopting a baffle to shield a region of the first organic film layer corresponding to the gold finger region on the substrate.

13. The light-emitting substrate according to claim 8, wherein the orthographic projection of the first inorganic film layer on the substrate does not overlap with the orthographic projection of the first via holes on the substrate.

14. The light-emitting substrate according to claim 8, wherein a pattern of the orthographic projection of the first inorganic film layer on the substrate is identical to a pattern of the orthographic projection of the second conductive layer on the substrate, wherein:
a pattern of the second conductive layer has a wiring segment, a connection segment and a redundant segment, the redundant segment is parallel to the wiring segment and is arrayed in a first direction, the redundant segment and the wiring segment extend in a second direction, the second direction is perpendicular to the first direction, one end of the connection segment is connected with the wiring segment, and other end is connected with the first conductive layer through the first via holes; and
a pattern of the first inorganic film layer has a first pattern part same as the wiring segment in pattern, a second pattern part same as the redundant segment in pattern, and a third pattern part same as the connection segment in pattern, an orthographic projection of the second pattern part on the substrate is located in an orthographic projection of the wiring segment on the substrate, and an orthographic projection of the third pattern part on the substrate does not overlap with the orthographic projection of the first via holes on the substrate.

15. The light-emitting substrate according to claim 14, wherein the connection segment comprises a first connection part and a second connection part extending in the second direction, and a third connection part connecting the first connection part with the second connection part, the first connection part and the second connection part are arrayed in the first direction, the first connection part, the second connection part and the third connection part cooperate to form an avoidance region, the third pattern part has a via hole avoidance region same as the avoidance region in pattern, and an orthographic projection of the via hole avoidance region on the substrate covers the orthographic projection of the first via holes on the substrate.

16. The light-emitting substrate according to claim 8, wherein the orthographic projection of the first inorganic film layer on the substrate covers a take-up region of the substrate, and does not overlap with a gold finger region of the take-up region.

17. The light-emitting substrate according to claim 8, further comprising a second inorganic film layer, wherein the second inorganic film layer is located between the first conductive layer and the first organic film layer.

18. The light-emitting substrate according to claim 8, wherein the first organic film layer comprises at least two of sub-organic film layers superimposed in a thickness direction of the substrate.

19. The light-emitting substrate according to claim 18, wherein an orthographic projection of at least one of the at least two the sub-organic film layers on the substrate covers the gold finger region of the take-up region of the substrate, and an orthographic projection of at least one of the at least two sub-organic film layers on the substrate does not overlap with the gold finger region of the take-up region of the substrate.

* * * * *